(12) United States Patent
Bailie et al.

(10) Patent No.: US 11,177,439 B2
(45) Date of Patent: Nov. 16, 2021

(54) PROCESSING OF PEROVSKITE FILMS USING INKS WITH COMPLEXING AGENTS

(71) Applicant: Tandem PV, Inc., Palo Alto, CA (US)

(72) Inventors: Colin David Bailie, Morgan Hill, CA (US); Chris Eberspacher, Palo Alto, CA (US); Matthew Cornyn Kuchta, San Francisco, CA (US)

(73) Assignee: Tandem PV, Inc., Palo Alto, CA (US)

( * ) Notice: Subject to any disclaimer, the term of this patent is extended or adjusted under 35 U.S.C. 154(b) by 151 days.

(21) Appl. No.: 16/808,175

(22) Filed: Mar. 3, 2020

(65) Prior Publication Data

US 2020/0287137 A1 Sep. 10, 2020

Related U.S. Application Data

(60) Provisional application No. 62/819,454, filed on Mar. 15, 2019, provisional application No. 62/814,852, filed on Mar. 6, 2019.

(51) Int. Cl.
*H01L 51/00* (2006.01)
*H01G 9/20* (2006.01)
(Continued)

(52) U.S. Cl.
CPC ....... *H01L 51/0004* (2013.01); *H01G 9/2059* (2013.01); *H01L 31/18* (2013.01); *H01L 51/0026* (2013.01); *H01L 51/42* (2013.01)

(58) Field of Classification Search
None
See application file for complete search history.

(56) References Cited

U.S. PATENT DOCUMENTS 10,249,441 B2 * 4/2019 Vak .............. H01G 9/0029
2016/0380125 A1 * 12/2016 Snaith .............. H01L 31/077
136/256

(Continued)

FOREIGN PATENT DOCUMENTS

WO 2018021794 A1 2/2018
WO 2018070791 A1 4/2018

OTHER PUBLICATIONS

Ahn et al., Highly Reproducible Perovskite Solar Cells with Average Efficiency of 18.3% and Best Efficiency of 19.7% Fabricated via Lewis Base Adduct of Lead(II) Iodide, Journal of the American Chemical Society, 137, Jun. 2015, pp. 8696-8699.

(Continued)

*Primary Examiner* — Dung A. Le
(74) *Attorney, Agent, or Firm* — MLO, a professional corp.

(57) ABSTRACT

A method can comprise providing an ink comprising reactants, a complexing agent, and a solvent, depositing the ink onto a substrate to form a wet film, drying the wet film to form a precursor layer, and annealing the precursor layer to form a perovskite film. The reactants can comprise a first and a second cation, a first metal, and a first and a second anion, wherein the first and second cations are different from each other, and the first and second anions are different from each other. The complexing agent can comprise a heterocyclic donor material. The perovskite film can comprise a mixed-cation mixed-halide perovskite material, and less than 5% by mass of the complexing agent. The perovskite film can also be formed using a one-step process.

28 Claims, 10 Drawing Sheets

(51) Int. Cl.
*H01L 31/18* (2006.01)
*H01L 51/42* (2006.01)

(56) References Cited

U.S. PATENT DOCUMENTS

2017/0338045 A1 11/2017 Vak et al.
2018/0030279 A1 2/2018 Irwin et al.

OTHER PUBLICATIONS

Bu et al., Synergic Interface Optimization with Green Solvent Engineering in Mixed Perovskite Solar Cells, Advanced Energy Materials, Jul. 2017, 10 pages.
Conings et al., A Universal Deposition Protocol for Planar Heterojunction Solar Cells with High Efficiency Based on Hybrid Lead Halide Perovskite Families, Advanced Materials, Oct. 2016, pp. 1-9.
Engelhardt et al., Lewis Base Adducts of Lead(II) Compounds. I Polymer Isomerism in Some 1 : 2 Adducts of Lead(11) Halides with Pyridine Bases, Aust. J. Chem, 40, Jun. 1987 pp. 2107-2114.
Gardner et al., Nonhazardous Solvent Systems for Processing Perovskite Photovoltaics, Advanced Energy Materials, May 2016, 8 pages.
Holliman, Solvent issues during processing and devic lifetime for perovskite solar cells, Materials Research Innovations, vol. 19, No. 7, Jan. 2016, pp. 508-511.
Jeon et al., Solvent-engineering for high performance inorganic-organic hybrid perovskite solar cells, Nature Mater 13, pp. 897-903, Jul. 2014.
Lee et al., A Bifunctional Lewis Base Additive for Microscopic Homogeneity in Perovskite Solar Cells, Chem 3, Aug. 2017, pp. 290-302.
Lee et al., Lewis Acid-Base Adduct Approach for High Efficiency Perovskite Solar Cells, Accounts of Chemical Research, American Chemical Society, Jan. 2016, pp. 311-319.
Li et al., A vacuum flash-assisted solution process for high-efficiency large-area perovskite solar cells, Science, vol. 353, Issue 6294, Jul. 2016, pp. 58-62.
Li et al., The Additive Coordination Effect on Hybrids Perovskite Crystallization and High-Performance Solar Cell, Advanced Materials, vol. 28, Oct. 2016, pp. 9862-9868.
Moore, Crystallization Kinetics of Organic-Inorganic Trihalide Perovskites and the Role of the Lead Anion in Crystal Growth, Journal of the American Chemical Society, Jan. 2015, pp. 2350-2358.
Pham et al., Enhanced perovskite electronic properties via a modified lead(II) chloride Lewis acid-base adduct and their effect in high-efficiency perovskite solar cells, Journals of Materials Chemical A, vol. 5, Feb. 2017, pp. 5195-5203.
Saliba et al., Incorporation of rubidium cations into perovskite solar cells improves photovoltaic performance, Science, vol. 354 Issue 6309 Oct. 2016, pp. 206-209.
Wang et al., Highly Efficient Perovskite Solar Cells Using Non-Toxic Industry Compatible Solvent System, Solar RRL, Nov. 2017, 9 pages.
Wharf et al., Synthesis and vibrational spectra of some lead(II) halide adducts with O-, S-, and N-donor atom ligands, Mar. 1976, 14 pages.
Xie et al., Efficient and Reproducible CH3NH3PbI3 Perovskite Layer Prepared Using a Binary Solvent Containing a Cyclic Urea Additive, ACS Applied Materials & Interfaces, Jan. 2018, vol. 10, pp. 9390-9397.
Yang et al., Perovskite ink with wide processing window for scalable high-efficiency solar cells, Nature Engery, vol. 2, No. 17038, Mar. 2017, 9 pages.

\* cited by examiner

PROCESSING OF PEROVSKITE FILMS USING INKS WITH COMPLEXING AGENTS

RELATED APPLICATIONS

This application claims the benefit of U.S. Provisional Patent Application No. 62/814,852, filed on Mar. 6, 2019, and entitled "Ligands for One-Step Processing of Perovskite Inks Without Anti-Solvents and a Rapid-Screening Method for Identifying Candidate Ligands," and U.S. Provisional Patent Application No. 62/819,454, filed on Mar. 15, 2019, and entitled "Method for Processing Films and Devices with Control of Solvent Partial Pressure," which are hereby incorporated by reference for all purposes.

GOVERNMENT LICENSE RIGHTS

This invention was made with government support under DE-AR0000888 awarded by the Department of Energy. The government has certain rights in the invention.

BACKGROUND

Thin-film metal-halide perovskite solar cells are one of the most promising solar technologies developed in the past 20 years. Having passed basic reliability tests, such as International Electrotechnical Commission (IEC) temperature cycling and damp heat tests, and achieved high single-junction and tandem small-area cell efficiencies, the key determinant for commercial viability is the development of scalable manufacturing processes. Many of the processes for fabricating perovskite solar cells, such as electrode deposition, heterojunction layer deposition, scribing, and module lamination can draw directly from pre-existing manufacturing processes and tools developed for solar panels or other thin-film technologies. However, perovskite absorber films themselves pose unique processing challenges that have no analogs in current solar manufacturing.

Solution-processing of perovskite films is key to the commercial value proposition of perovskite solar cells, enabling large-scale manufacturing with high throughput and low manufacturing costs. Solution-processing comprises the formation of final films by the deposition of one or more precursor layers from one or more wet films of reactant liquids, e.g., an ink comprising reactants dissolved in a suitable solvent. Perovskite reactant inks typically require the use of complex processes and hazardous materials. Typical perovskite reactants are soluble in only a small number of highly polar solvents whose physical properties make film formation unusually difficult due to the tendency for both solvent removal and perovskite nucleation and crystal growth to overlap during drying and annealing steps. This overlap leads to perovskite films deposited using one-step solution deposition methods—i.e. deposition of all of the constituents of a final perovskite film in a single step, rather than depositing some film constituents in a first step, and then depositing additional film constituents in one or more subsequent steps—to be low quality (e.g., average grain size less than film thickness, presence of undesirable secondary phases, and/or low minority carrier lifetimes) and non-uniform (e.g., have variations in thickness, composition and/or microstructure).

To overcome these problems, most high-quality perovskite solar cells are made using cumbersome two-step processes and/or using timing-critical solvent removal processes immediately subsequent to one-step wet film deposition.

In a two-step process, one or more of the perovskite reactants is deposited in a first step, and one or more additional perovskite reactants are deposited in a second step. For example, in a first step $PbI_2$ can be deposited from a $PbI_2$-containing ink and in a second step methylammonium iodide (MAI) can be deposited from a MAI-containing ink so that the two-step reactant layer stack contains the key perovskite components. In this example the lead, methylammonium and iodine are subsequently processed (e.g., by thermal annealing) to form a methylammonium lead iodide (MAPI) perovskite film. Two-step processes comprise multiple steps that add cost, complexity and yield losses.

FIG. 1 shows an example of a typical perovskite film one-step process 100 utilizing solvent removal with an anti-solvent intermediate process, in which a multi-reactant perovskite ink 102 is deposited in one step 104, and an anti-solvent is applied in a subsequent timing-critical intermediate step 106. An amorphous intermediate layer is formed in step 108, which is then annealed to form the perovskite film in step 110. In an anti-solvent wash the original polar solvent is quickly displaced by another solvent (i.e., the anti-solvent) in which the perovskite precursor reactants are insoluble such that perovskite precursors rapidly precipitate as a mixed-precursor reactant layer. This can mitigate differential precipitation that might occur if the original solvent were slowly removed and in so doing mitigates the formation of secondary phases and compositional non-uniformities. However, typical anti-solvents are hazardous flammable chemicals (e.g., diethyl ether, chlorobenzene, dichlorobenzene, etc.), and the precision application and removal of anti-solvents as practiced in research laboratories would be impossible, uneconomic and/or unsafe in volume manufacturing.

Some of the disadvantages of one-step inks can also be mitigated by using rapid, timing-critical drying, such as subjecting a just-deposited wet reactant film to forced convection or vacuum (as shown in FIG. 1, step 106) to rapidly remove the original solvent (typically within tens of seconds) without displacement by an anti-solvent. However, timing-critical drying would be impossible, uneconomic and/or impractical in volume manufacturing of large-area products, e.g. 1-2 $m^2$ solar panels.

Some of the disadvantages of one-step inks can be mitigated by using reactants and/or solvents that inhibit perovskite film nucleation and crystallization. For example, in an ink comprising an acetate, the acetate can slow perovskite formation until the acetate is later removed with high-temperature annealing. Alternatively, in an ink comprising dimethylsulfoxide (DMSO), the DMSO can slow the reaction between lead iodide ($PbI_2$) and other cation species, retarding perovskite nucleation and crystallization. Unfortunately, the nucleation- and crystallization-inhibiting reactants and solvents reported in the literature do not readily accommodate mixed-cation, mixed-halide single-ink compositions needed for high-value perovskite film properties, in particular cesium-halide reactants and cation-bromide reactants. Additionally, the nucleation and crystallization-inhibiting reactants and solvents reported in the literature require anti-solvents and/or high annealing temperatures in order to remove the inhibiting material and form the perovskite.

SUMMARY

In some embodiments, a method comprises providing an ink comprising reactants, a complexing agent, and a solvent, depositing the ink onto a substrate to form a wet film, drying the wet film to form a precursor layer, and annealing the precursor layer to form a perovskite film. The reactants can comprise a first and a second cation, a first metal, and a first and a second anion, wherein the first and second cations are different from each other, and the first and second anions are different from each other. The complexing agent can comprise a heterocyclic donor material. The perovskite film can comprise a mixed-cation mixed-halide perovskite material, and less than 5% by mass of the complexing agent. The perovskite film can also be formed using a one-step process.

In some embodiments, a method comprises providing an ink comprising reactants, a complexing agent, and a solvent, depositing the ink onto a substrate to form a wet film, drying the wet film to form a precursor layer, and annealing the precursor layer to form a perovskite film. The reactants can comprise a first and a second cation, a first metal, and a first and a second anion, wherein the first and second cations are different from each other, and the first and second anions are different from each other. The perovskite film can comprise a mixed-cation mixed-halide perovskite material, and less than 5% by mass of the complexing agent. The perovskite film can be formed using a one-step process.

In some embodiments, a method comprises providing an ink comprising reactants, a complexing agent, and a solvent, depositing the ink onto a substrate to form a wet film, drying the wet film to form a precursor layer, and annealing the precursor layer to form a perovskite film. The reactants can comprise a first and a second cation, a first metal, and a first and a second anion, wherein the first and second cations are different from each other, and the first and second anions are different from each other. The complexing agent can comprise a molar solubility greater than 0.05 to at least one of the reactants, a complex binding strength to the first metal greater than that of dimethylformamide (DMF) and less than that of dimethylsulfoxide (DMSO), and a boiling point less than 200° C. The perovskite film can comprise a mixed-cation mixed-halide perovskite material, and less than 5% by mass of the complexing agent.

DETAILED DESCRIPTION

Figure 1:
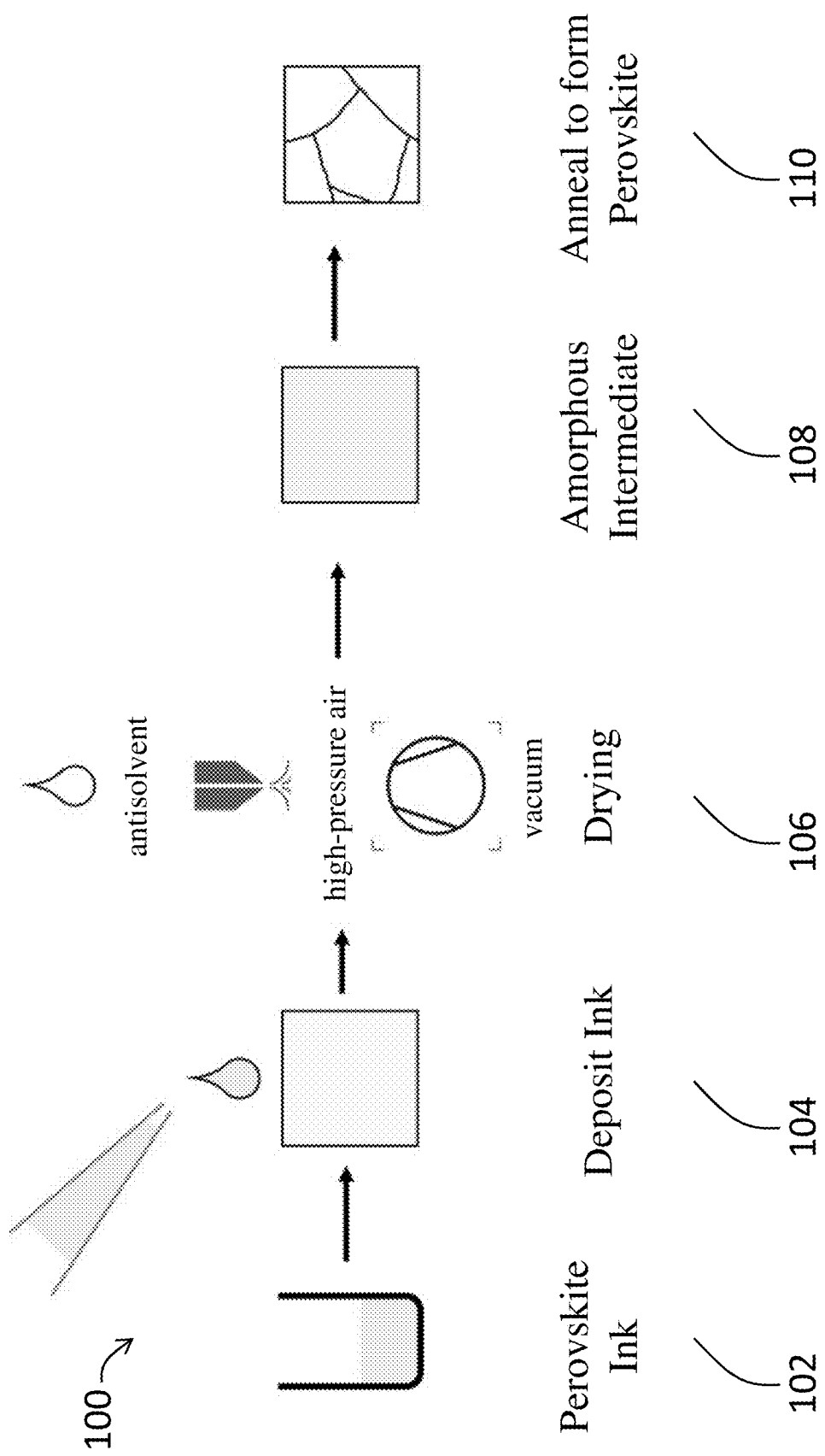
FIG. 1 (Prior Art) shows an example of a typical perovskite film one-step process.

Described herein are methods that facilitate one-step perovskite formation at moderate annealing temperatures without the use of anti-solvents or rapid drying. One-step perovskite films with high-quality and uniformity are achieved by using one or more complexing agents. In some embodiments of the methods described herein, a complexing agent is added to an ink containing all of the constituents of a perovskite film to be produced. The ink is then deposited (e.g., on a substrate), dried, and annealed to form the final perovskite film in a one-step process. This is a one-step process since only one coating step is performed to produce the perovskite film.

Typical perovskite film production processes use multiple precursor deposition steps. The use of multiple precursor deposition steps is cumbersome as it requires extra processing equipment, time and materials relative, for example, to a one-step process in which all of the key components of the final perovskite film are present in a single reactant ink.

In contrast, one-step perovskite processing is advantageous in that final film formation requires only a single deposition step and that final film composition depends on the composition of the lone multi-reactant formulation and not on the precise sequential deposition of multiple reactant formulations. The term "one-step" as used herein (e.g., as in one-step processing, one-step methods, one-step films, one-step perovskite formation, etc.), refers to deposition of all of the constituents of a final perovskite film in a single step, rather than depositing some film constituents in a first step, and then depositing additional film constituents in one or more subsequent steps, where a constituent is a cation, metal or anion present in the final perovskite film. In other words, in one-step processing, all of the key components of the desired final perovskite film are present in a single multi-reactant formulation that is deposited in a single step. For example, a single printable ink comprising lead, methylammonium and iodine in appropriate equivalent ratios can be printed in a single step using fewer tools and less time than are typical with two-step processing that sequentially deposits a lead iodide ink and then overcoats the lead iodide with a methylammonium iodide ink. The term "equivalent ratios" or simply "equivalents" as used herein refers to number (e.g., molar or atomic) ratios between constituents of a perovskite film, or between constituents of an ink used to form a perovskite film. For example, the equivalent ratio of Pb to formamidinium in a perovskite film, is the ratio of the number of Pb atoms to the number of formamidinium groups in the film. In another example, the equivalent ratio of a complexing agent to Pb in an ink used to form a perovskite film is the ratio of the number of complexing agent molecules (or species) to the number of Pb atoms in the ink. The ease, speed and cost effectiveness of one-step perovskite processing are considerable advantages in commercial production.

However, one-step perovskite reactant inks necessary for one-step processing are often difficult to prepare and to use, due for example to significant variations in reactant solubility and stability in solvents, and variations in perovskite nucleation rates between different reactants. Many candidate one-step formulations yield non-uniform perovskite films due to differential precipitation, segregation, reactant wet film dewetting, inferior final perovskite film crystallinity, and other disadvantageous effects. This is particularly the case for more complex perovskite film compositions, such as perovskite films with multiple cations (e.g., methylammonium, formamidinium, Cs, Rb, etc.) and multiple halides (e.g., Br, I, Cl, etc.). One-step mixed-cation mixed-halide reactant inks often yield low quality non-uniform perovskite films with multiple single-cation regions rather than the intended uniform mixed-cation perovskite films. The present methods describe how to form a high-quality and uniform perovskite film using one-step methods.

One-step perovskite processing described herein can eliminate the use of anti-solvents altogether. This is advantageous since the use of anti-solvents as practiced in research laboratories would be impossible, uneconomic and/or unsafe in volume manufacturing.

One-step perovskite processing described herein can also eliminate the need for rapid, timing-critical drying. This is advantageous since timing-critical drying would be impossible, uneconomic and/or impractical in volume manufacturing of large-area products.

One-step perovskite processing described herein can also eliminate the need for high-temperature annealing. That is advantageous since high-temperature processing can degrade the properties of the perovskite bulk material and of the perovskite/heterojunction layer interfaces.

Additionally, one-step processing of mixed-cation mixed-halide perovskites using the complexing agents described herein can eliminate the need for anti-solvents and high annealing temperatures. In contrast, the nucleation- and crystallization-inhibiting reactants and solvents reported in the literature do not readily accommodate mixed-cation mixed-halide single-ink compositions, and also require anti-solvents and/or high annealing temperatures.

Figure 2A:
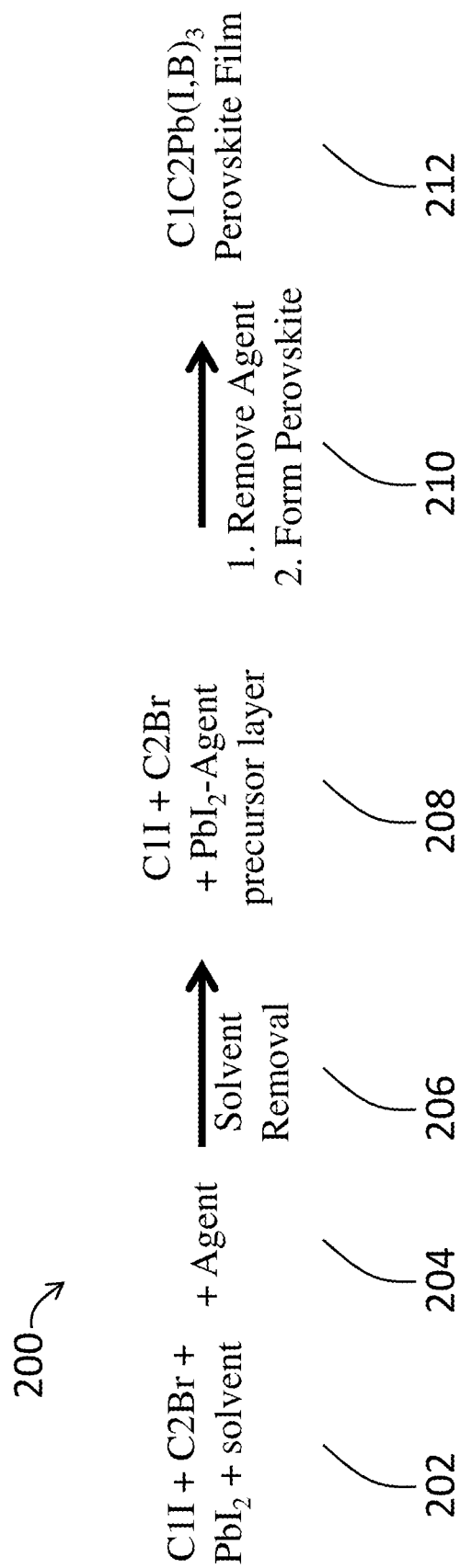
FIG. 2A shows an example of a present one-step process for depositing a high-quality uniform perovskite, in accordance with some embodiments.

FIG. 2A shows an example of a one-step process 200 for depositing a high-quality uniform perovskite film without the use of anti-solvents or high temperature annealing. In step 202, the reactant solution is provided including reactants for forming a perovskite film. Reactants are species that contain the constituents of the final perovskite film (e.g., the cation(s), metal(s) and anion(s) that will make up the final perovskite film). The reactants can also contain components that are not incorporated into the final film and are removed (or volatilized) after the ink is coated and before the final perovskite film is formed. The reactants are an iodine-containing cationic reactant C1I, a bromine-containing cationic reactant C2Br and $PbI_2$ in this example, where C1 and C2 are cations for the iodine and bromine cationic reactants, respectively. For example, C1 and C2 can be methylammonium or formamidinium. In step 204 a complexing agent ("Agent" in FIG. 2A) is added to the precursors to form the reactant ink. The reactant ink can then be deposited to form a wet film, and then in step 206, the reactant solution solvent is removed to form a precursor layer in step 208. Step 206 can also be referred to as a drying step. The precursor layer in this example contains C1I, C2Br, and a $PbI_2$-agent adduct (or complex). In step 210, the complexing agent is removed (e.g., an undetectable amount or less than 5% by mass remains in the final film), and the perovskite film is formed. In some cases, step 210 is an annealing step, where the precursor layer is exposed to an elevated temperature (e.g., from 100° C. to 350° C.) for a given time (e.g., from 30 seconds to a few hours). A high-quality and uniform perovskite film is then formed in step 212. In some embodiments, a high-quality perovskite film has an intended mixed-cation mixed-halide perovskite crystal structure (e.g., as observed by x-ray diffraction (XRD)), no (or a small concentration of) unintended secondary phases (e.g., as observed using XRD), a low concentration of impurities (e.g., residue of the complexing agent used during processing that remains in the final film), a carrier mobility above 15 $cm^2$/V-s, and a carrier lifetime above 200 ns. In some embodiments, a uniform perovskite film has a uniform composition, a uniform thickness, and a uniform morphology (e.g., surface roughness, grain size, cracks, and pinholes).

The high-quality and uniformity of the perovskite film in step 212 are achieved by using one or more complexing agents that 1) show high solubility to candidate perovskite reactants, especially cesium-halide compounds and cation-bromide compounds, 2) bind strongly enough to disrupt perovskite formation (i.e., complex with Pb more strongly than does dimethylformamide (DMF)), and 3) evaporate at a kinetic rate appropriate for forming high-quality perovskite layers, which generally requires a boiling point of the complexing agent of less than 200° C. and a complex binding strength to Pb less than that of dimethylsulfoxide (DMSO). In this example, the Pb-agent adduct (i.e., the intermediate product of Pb with the complexing agent) inhibits perovskite formation during the solvent removal step. Furthermore, the agent can be chosen such that the strength of the Pb-agent bond is tuned to control the nucleation and crystallization of the perovskite film.

Figure 2B:
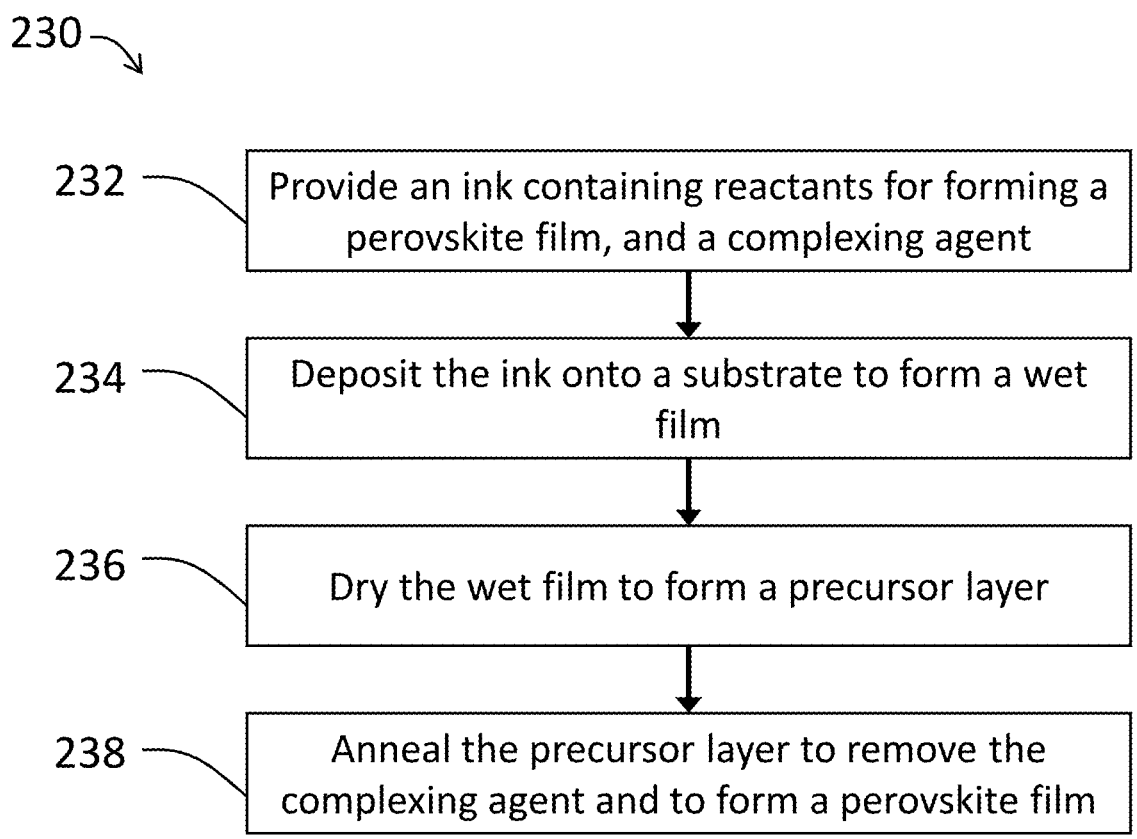
FIG. 2B is a flow chart of a method for forming a perovskite film using an ink containing a complexing agent in a one-step process, in accordance with some embodiments.

FIG. 2B is a flow chart of a method 230 for forming a perovskite film using an ink containing a complexing agent in a one-step process. In step 232, an ink is provided for forming a perovskite film, where the ink containing one or more reactants and one or more complexing agents. The ink can also contain one or more solvents, such as an anhydrous solvent, or a polar solvent. In some embodiments, the reactants contain two or more cations, one or more metals, and two or more anions, most of which will be incorporated as constituents in the final perovskite film. For example, one of the reactants can be formamidinium-iodide, which contains a formamidinium cation and an iodide anion. In another example, one of the reactants can be $PbI_2$, which contains a lead metal and iodide anions. In another example, one of the reactants can be methylammonium-bromide, which contains a methylammonium cation and a bromide anion. The preceding are non-limiting examples, and other reactants can be used to form perovskite films with different cation, metal, and anion constituents as described herein. In some embodiments, the complexing agent contains a heterocyclic donor (i.e., heterocycle donor) material.

In step 234, the ink is deposited to form a wet film. In some embodiments, the ink is deposited onto a substrate in step 234. The substrate can contain any rigid or flexible material, such as glass, plastic, or metal. In some embodiments, a transparent conducting film is deposited on the substrate before the ink is deposited. The transparent conductive film can be a single layer or multiple layers, for example containing fluorine doped tin oxide (FTO), indium tin oxide (ITO), tin oxide (e.g., $SnO_2$), doped zinc oxide (ZnO), titanium oxide ($TiO_2$), and/or nanowires (e.g., composed of silver or carbon nanotubes). In step 236, the wet film is dried to form a precursor layer. In step 238, the precursor layer is annealed to remove the complexing agent(s) and to form a perovskite film.

In some embodiments, the complexing agent is not present, or is present in low concentrations, in the final perovskite film produced using method 200 in FIG. 2B. In some embodiments, the final perovskite film produced using method 200 in FIG. 2B contains an amount of the complexing agent that is less than 5% by mass, less than 2% by mass, less than 1% by mass, less than 0.1% by mass, or less than 0.01% by mass. In some embodiments, there is an undetectable amount of complexing agent in the final perovskite film, when measured using an analysis technique that provides compositional information such as XRD, x-ray photoelectron spectroscopy (XPS), or Fourier transform infrared spectroscopy (FTIR).

To date very few complexing agents have been reported in the perovskite literature. Most of the literature relates to primary solvents that can interact with lead salts to slow perovskite formation (e.g., DMSO, N-Methyl-2-pyrrolidone (NMP), and dimethylformamide (DMF)). Beyond these primary solvents, thiourea, 1,3-dimethyl-2-imidazolidinone, and urea have been used in concert with an anti-solvent and/or non-manufacturable drying step.

A unique attribute of the present methods for producing perovskite films and solar cells is that one or more select complexing agents are present in a single-ink mixed-cation mixed-halide reactant ink (e.g., in step 232 in FIG. 2B) and these complexing agents are not present as a constituent of the final perovskite film. This is in sharp contrast to conventional approaches that incorporate different types of cations in the final perovskite films. Perovskites can be described using the general composition $CMX_3$, where C is a cation, M is metal, and X is halide, and some conventional approaches seek to use different species as the cations C in the final film. For example, heterocyclic organic materials (e.g., pyridine, quinoline, and others) have been identified as candidate cation replacements for methylammonium or formamidinium, which are present in the final perovskite film. In the present disclosure, the presence of the complexing agents is transitory. The complexing agents are utilized to improve the properties of the ink formulation, and the complexing agents are removed during processing (e.g., evaporate during an annealing step) and are not a substantive constituent of the final perovskite film.

Another unique attribute of the present methods for producing perovskite films and solar cells is that one or more select complexing agents are present in a single-ink mixed-cation mixed-halide reactant ink (e.g., in step 232 in FIG. 2B) but are not present in or on the final perovskite film. This is in sharp contrast to conventional approaches in which different species are used as passivating agents on the surfaces and/or grain boundaries, and are therefore present in or on the final perovskite film. For example, heterocyclic organic materials (e.g., pyridine, acridine, and others) have been identified as candidate passivating agents for the surfaces and/or grain boundaries of perovskite films. In the present disclosure, the complexing agents critically affect the stability of the perovskite reactant ink, the formation of a uniform reactant layer, and the formation of a high-quality, uniform-composition final perovskite film, and the complexing agents are not substantively present in, on or at the grain boundaries of the final perovskite film.

Still another unique attribute of the present methods for producing perovskite films and solar cells is that select complexing agents are used in a mixed-cation mixed-halide single-ink process where the perovskite final film is formed by forming a wet film of a single multi-reactant ink comprising all of the components of the mixed-cation mixed-halide perovskite film and drying and annealing that single wet film to form a final perovskite film, as shown in method 230 in FIG. 2B). This is in sharp contrast to conventional approaches in which the reaction between cations, metals, and halides during perovskite film formation is controlled by sequentially depositing multiple inks (e.g., by first depositing a metal halide using a first ink and then depositing a cation halide using a second ink in a more complex sequence of multiple deposition and drying steps). In the present disclosure, the complexing agents facilitate mixing all of the required cations and halides in a single multi-reactant ink so that a single wet film deposition step and subsequent drying and annealing steps suffice to produce a high-quality, low-cost mixed-cation mixed-halide perovskite film.

Still another unique attribute of the present methods for producing perovskite films is that select complexing agents facilitate the formation of high-quality perovskite films as are needed for the fabrication of efficient solar cells. For example, the present perovskite films can be near perovskite stoichiometry and have minimal secondary phases. A "stoichiometric perovskite," as used herein, describes a perovskite that has a metal to cation ratio that is equal to 1. A perovskite film with a "near perovskite stoichiometry" or a "near-stoichiometric perovskite," as used herein, describes a perovskite that has a metal to cation ratio that is close to 1 (e.g., where the metal to cation ratio deviates from 1 by less than 5%, or less than 4%, or less than 3%, or less than 2%, or less than 1%). This is in sharp contrast to conventional approaches in which limitations in reactant inks and/or the conversion of reactant ink wet films to final perovskite films often require targeting off-stoichiometry films, e.g., with 5% or more excess Pb such that the resulting perovskite films have $PbI_2$ secondary phases.

Still another unique attribute of the present methods for producing perovskite films and solar cells is that select complexing agents facilitate the formation of high-quality perovskite films as are needed for the fabrication of efficient solar cells from reactant inks where the molar ratios of the perovskite components in the reactant ink are substantially the same as those in the final perovskite film. This is in sharp contrast to conventional approaches in which limitations in reactant inks and/or the conversion of reactant ink wet films to final perovskite films often require reactant inks enriched in one or more perovskite components relative the target final film composition, e.g. inks with 5% or more excess cations to offset cation loss during processing.

In some embodiments, one or more complexing agents are used in multi-reactant inks (e.g., in step 232 in FIG. 2B) with near-stoichiometric amounts of each perovskite film component, i.e., ink composition approximately equal to a specific target stoichiometric perovskite film phase. For example, according to some embodiments of the present invention a reactant ink intended for the formation of a $FA_{0.95}Cs_{0.05}PbI_{2.55}Br_{0.45}$ (where FA is formamidinium) perovskite film would comprise reactants in relative concentrations nearly equivalent to ratios of the final film, i.e., about 0.95 moles FA to 0.05 moles Cs to 1 mole Pb to 2.55 moles I to 0.45 moles Br. The final perovskite film has target concentration ratios (or, equivalent ratios) of cations to metals, metals to anions, and cations to anions, as well as concentration ratios of a first cation to a second cation, a first metal to a second metal, and/or a first anion to a second anion in mixed-cation, mixed-metal, and/or mixed-anion perovskite films. For example, in the final perovskite film the ratio of metals (e.g., Pb) to cations (e.g., FA and Cs) is about 1, or is from 0.96 to 1.04, or is from 0.97 to 1.03, or is from 0.98 to 1.02. In some embodiments, each anion, metal, and cation is present in the reactant ink (e.g., in step 232 in FIG. 2B) in approximately the concentration ratios targeted for the final perovskite film (i.e., in near-stoichiometric amounts). For example, each anion, metal, and cation is present in the reactant ink in concentration ratios that are less than 5%, or less than 1%, or less than 0.1% different from the targeted concentration ratios in the final perovskite film. In other embodiments, the perovskite film can have a stoichiometry other than near-stoichiometric, for example, where the metal to cation ratio is from 0.9 to 1.1, or is from 0.95 to 1.05.

In some embodiments, one or more complexing agents are used in reactant inks for forming mixed-cation mixed-halide perovskite films in one-step processing (e.g., in method 200 in FIG. 2B) with near-stochiometric amounts of each perovskite component, where at least one of the heterocycle complexing agents 1) shows greater than 0.05 molar solubility to certain perovskite components (e.g., cesium-halide compounds and cation-bromide compounds), 2) has a complex binding strength to Pb greater than that of dimethylformamide (DMF) and less than that of DMSO, and 3) has a boiling point less than 200° C.

Table 1 contains a list of complexing agents that can be used in different embodiments of the present inks and methods (e.g., in method 200 in FIG. 2B). The complexing agents in Table 1 are heterocyclic donors and are organized into different categories, including those that are oxygen donors, nitrogen donors, nitrogen-oxygen donors, phosphorous donors, sulfur donors, and selenium donors. For example, Table 1 includes examples of pyridines, 4-substituted pyridines, quinolines, and iso-quinoline derivatives. The efficacy of each of the complexing agents in Table 1 was not evident from the structures or properties, and had to be empirically determined using the testing methods described below.

TABLE 1

Complexing agents tested

| None (DMF) | Oxygen donor | Nitrogen-Oxygen donor |
|---|---|---|
| | DMSO | 2,4,5-Me3-Oxazole |
| | H4-thiophene oxide | 2-Et-oxazoline |

| Nitrogen donor | | |
|---|---|---|
| Pyridine (PYR) | 3-Me—PYR | 2,6-(MeO)2—PYR |
| 2-Br—PYR | 4-Me—PYR | 2-NH2—PYR |
| 2-Et—PYR | 2,4-Me2—PYR | 3-Ph—PYR4—Ph—PYR |
| 3-Et—PYR | 2,6-Me2—PYR | 2-iPr—PYR |
| 4-Et—PYR | 3,4-Me2—PYR | 4nPr—PYR |
| 5-Et,2-Me—PYR | 3,5-Me2—PYR | 4-tert butyl-PYR |
| 2-EtO—PYR | 2,3,5-Me3—PYR | 2,3-cyclopento-PYR |
| 2-F—PYR | 2,4,6-Me3—PYR | 4(3-pentyl)-PYR |
| 2,4,6-F3—PYR | 2-MeO—PYR | 2-TMS-PYR |
| 2-Me—PYR | 4-MeO—PYR | |
| | | Pyrazine (PYE) |
| Imidazole (IMID) | H4-quinoline (QUIN) | 2,5Me2—PYE |
| n-Bu-IMID | 1-Me-isoQUIN | 2-Et—PYE |
| N—Me-IMID | 2-Me-QUIN | 2,3Et2—PYE |
| 1,2-Me2-IMID | 3-Me-Quinoline | 2,6-Me2—PYE |
| 1-Et-IMID | isoquinoline | 2,3,5Me3—PYE |
| 1,2,4,5-Me4-IMID | 5,6,7,8-H4-isoQuinoline | 2,3,5,6Me4—PYE |
| | | 2-Pr—PYE |
| Morpholine | 1-H-1,2,3-triazole | |
| N—Me-morpholine | 1-H-1,2,4-triazole | 1-Me-Pyrazole |
| 3-NH2 | | |

| Phosphorous Donor | Sulfur donor | Selenium donor |
|---|---|---|
| Me2PPh | thiophene | Me2Se |
| MePPh2 | 4H-thiophene | Me2Se2 |
| | Et2S | |

In some embodiments, one or more of the materials in Table 1 are used as complexing agents in reactant inks for one-step deposition of precursor layers to form perovskite films.

In some embodiments, one or more of the materials in Table 1 are used as complexing agents in reactant inks for perovskite films, and the reactant inks further comprise a solvent, such as an anhydrous solvent, a polar solvent, DMF, dimethylacetamide (DMAC), and combinations thereof.

In some embodiments, one or more of the materials in Table 1 are used as complexing agents in reactant inks (e.g., in step 232 in FIG. 2B) for perovskite films (e.g., in step 238 in FIG. 2B), and the ink comprises reactants containing the constituents of the perovskite film. The reactants for forming the perovskite films can be reactants for methylammonium lead iodide perovskite films, reactants for mixed-cation perovskite films such as formamidinium cesium lead iodide, reactants for mixed-halide perovskite films such as methylammonium bromide iodide, reactants for mixed-cation mixed-halide perovskite films such as formamidinium cesium lead iodide bromide. In some cases, the reactants are reactants for more complicated mixtures of cations in perovskite films including but not limited to methylammonium, formamidinium, cesium, potassium and rubidium, metals including but not limited to lead and tin, and of halides including but not limited to bromide, iodide and chloride. In some embodiments, the reactants listed above can be used to form perovskite films in one-step processes.

In some embodiments, one or more of the materials in Table 1 are used as complexing agents in reactant inks for perovskite films that are processed (e.g., in steps 234, 236 and 238 in FIG. 2B) in air, in dehumidified air with less than 10% relative humidity (RH), in dehumidified air with less than 5% RH, in dehumidified air with less than 2% RH, and in low-oxygen atmospheres (e.g., with less than 1% oxygen, or less than 100 ppm of oxygen, or less than 10 ppm of oxygen) such as nitrogen for example in a nitrogen-purged glovebox.

In some embodiments, one or more of the materials in Table 1 are used as complexing agents in reactant inks for perovskite films that are dried (e.g., in step 236 in FIG. 2B) in an environment with nitrogen forced convection, an environment with air forced convection, or in a low-pressure environment (e.g., with pressure from 0.01 Pa to 3000 Pa), or in other atmospheres including atmospheres with controlled solvent partial pressures (e.g., DMF at 0.2-0.25 mm Hg at 20° C. to moderate primary solvent evaporation from a wet film). In some cases, the drying step can be done in an evacuated vessel, or in a low-pressure enclosure. In some embodiments, the solvent(s) used in the atmosphere during drying can be the same as the solvent(s) used in the ink (e.g., in step 232 in FIG. 2B), or different than the solvents used in the ink.

The early stages of the drying process (e.g., in step 236 in FIG. 2B) can be important to produce a high-quality perovskite film. There are two possible early-stage ink-drying possibilities: (1) in-flight drying of ink droplets for free-flight spraying-type processes (e.g. ink-jet, spray-coating, aerosol coating, etc.) in which ink transfers from source (e.g., a spray nozzle) to substrate in the form of droplets, and (2) natural convective and evaporative drying of the wet coating in the time between coating deposition (e.g., in step 234 in FIG. 2B) and coating-to-final-film conversion (e.g., in step 238 in FIG. 2B). In-flight ink droplet drying (1) is specific to free-flight spraying-type processes while initial wet coating drying (2) is relevant for all processes. Both early-stage drying effects can result in nucleation of solids prior to purposeful final perovskite film formation and crystallization during conversion; early-stage nucleation can negatively affect grain size, orientation, roughness, composition, and crystal structure of the final perovskite PV absorber film.

The natural drying processes during and after the coating of reactant inks to form metal-halide perovskite films may be mitigated (e.g., by reducing the drying rate) through control of the atmosphere proximate to the wet ink coating. For example, the environment within the coating system can contain partial pressures of the ink solvents up to but not exceeding the equilibrium vapor pressure of those solvents.

In some embodiments, a method for mitigating issues associated with early-stage drying is to introduce a solvent into the proximate atmosphere of a perovskite film during or after deposition. In some cases, the proximate atmosphere is saturated with an equilibrium vapor pressure of the solvents contained in the printed ink. In other cases, one or more solvents that are the same or different from the solvent(s) in the printed ink are introduced in the proximate atmosphere, at equilibrium vapor pressures equal to or less than those of saturation. A partial list of solvents compatible with processing metal-halide perovskite compositions is listed in Table 2 along with a representative equilibrium vapor pressure for each solvent at 20° C. In a simple implementation of this method, an open container of each solvent may be placed within the equipment used to deposit the perovskite precursor film (e.g., within a printing tool). In another example implementation, carrier gas may be flowed through vessels containing each solvent before being introduced into the chamber of the perovskite deposition tool. Additionally, in some embodiments, the deposition tool chamber is temperature controlled. In some cases, sub-saturation of the solvents in the proximate atmosphere is similarly effective as full saturation for limiting early-stage drying by sufficiently slowing the kinetics of drying. Over-saturation of the solvents may be detrimental to the perovskite precursor ink coating as excess solvent in the atmosphere may condense onto the coating and may degrade film morphology, porosity and/or compositional uniformity. Therefore, in some cases it is advantageous to keep all components of the system at or above the condensation temperature (dew point) of the solvents based on the vapor pressure used.

TABLE 2

Solvents in atmosphere during perovskite drying

| Solvent | Boiling Point (° C.) | Vapor Pressure (mmHg, 20° C.) |
|---|---|---|
| DMF | 152-154 | 2.7 |
| DMSO | 189 | 0.42 |
| Gamma-Butyrolactone (gBL) | 204 | 1.5 |
| NMP | 202-204 | 0.29 |
| Acetonitrile (MeCN) | 81.3-82.1 | 72.8 |
| Ethanol (EtOH) | 78.2 | 44.6 |
| Acetic acid | 118-119 | 11.6 |
| Thiourea | 150-160 | 7.5E−8 |
| Pyridine | 115.2 | 16 |
| Aniline | 184.1 | 0.6 |

In some embodiments, one or more of the materials in Table 1 are used as complexing agents in reactant inks for perovskite films, where the precursor layer is converted to a perovskite film by thermal annealing (e.g., in step 238 in FIG. 2B), by thermal annealing from 70° C. to 350° C., from 100° C. to 275° C., from 125° C. to 250° C., at approximately 150° C., or at approximately 250° C., for durations from 0.5 to 2 minutes, from 0.5 to 10 minutes, from 0.5 to 50 minutes, or from 0.5 minutes to 5 hours.

In some embodiments, one or more of the materials in Table 1 are used as complexing agents in reactant inks for perovskite films without using any anti-solvents.

In some embodiments, one or more of the materials in Table 1 are used as complexing agents in reactant inks for perovskite films, where the deposited precursor layer is processed using anti-solvents. For example, an anti-solvent could optionally be applied to a wet film after deposition (e.g., after step 234 in FIG. 2B). In some cases, the anti-solvent can then be partially or completely removed in a drying step (e.g., in step 236 in FIG. 2B). In some cases, the anti-solvent treatment can constitute the drying step by the anti-solvent serving to displace the original solvent to effect a similar precursor layer dryness as might be possible with evaporative drying. After the deposition step the layer can be left in place or moved to a separate chamber to complete the anti-solvent application and removal. Some non-limiting examples of anti-solvents are diethyl ether, ethyl acetate, isopropyl alcohol, toluene, anisole, chlorobenzene and dichlorobenzene.

In some embodiments, one or more of the materials in Table 1 are used as complexing agents in reactant inks for perovskite films, where the inks are deposited as wet films (e.g., in step 234 in FIG. 2B) by spin-coating, slot-die printing (or slot-die coating), blade coating, dip coating, spraying, screen printing, ink-jet printing, gravure printing, offset printing, waterfall coating, or other solution deposition methods commonly used.

In some embodiments, one or more of the materials in Table 1 are used as complexing agents in reactant inks for perovskite films, where the molar ratio of a complexing agent relative to metal (e.g. Pb) in the reactant ink (e.g., in step 232 in FIG. 2B) is from 0.5 to 5, from 1 to 3, from 1 to 2.5, or from 1.4 to 2. The optimal ratio of moles of complexing agent to moles of metal in the ink—i.e., the molar equivalents (or simply equivalents) of agent to metal—depends on the agent, the molarity of metal in the ink (i.e., moles of metal per liter of solution), the nature of the other reactants in the ink, the nature of other solvents—if any—in the ink, the method for drying the wet film, and other factors.

In some embodiments, one or more of the materials in Table 1 are used as complexing agents in reactant inks for perovskite films (e.g., in step 232 in FIG. 2B), where the Pb molarities in the ink—i.e., moles of Pb per liter of ink—are from 0.25 to 1.5, from 0.5 to 1.25, or is about 1.

EXAMPLES

Example 1: Rapid Screening Methods for Complexing Agents

In this non-limiting Example, complexing agents with more ideal processing characteristics than those that require anti-solvent processing were screened using a rapid screening method to empirically discover agents that meet simple perovskite processing criteria. The rapid screening method was applied to a broad group of about 70 heterocyclic donor complexing agents (shown in Table 1). Table 3 shows some of the most promising agents that passed the rapid screening tests. The differences between the complexing agents listed in Table 3 and the agents listed in Table 1 that did not pass the screening described in this Example are not obvious. For example, there are 7 pyridine complexing agents in Table 3 that passed the screening, while the majority of the pyridine complexing agents in Table 1 did not pass the screening in this Example.

TABLE 3

Agents Passing Screening Tests

| | |
|---|---|
| 4-tert butyl-pyridine | 3-Me-Quinoline |
| 4nPr-pyridine | 2-Me-Quinoline |
| 2,4,6-Me3-pyridine | 5,6,7,8-H4-isoQuinoline |
| 4-MeO-pyridine | 1-Me-isoQuinoline |
| 2,3-cyclopento-pyridine | |
| 2,3,5-Me3-pyridine | |
| 3-Et-pyridine | |

The rapid screening tests in this example were successfully used to identify agents that enabled the one-step formation of high-quality perovskite cells without the use of anti-solvents or high temperature annealing steps. Additionally, the agents were used in from 1 to 3 equivalents relative to lead and the one-step inks were deposited by both spin-coating and slot-die coating using simple coat, air-dry, and bake processes.

The rapid screening methodology began with identifying candidate materials based in part on physical properties (e.g., vapor pressure and boiling temperature) and reported interactions with lead compounds. These initial criteria identified nitrogen donor heterocycles, e.g., pyridine and its derivatives, as potential candidates.

Figure 3:
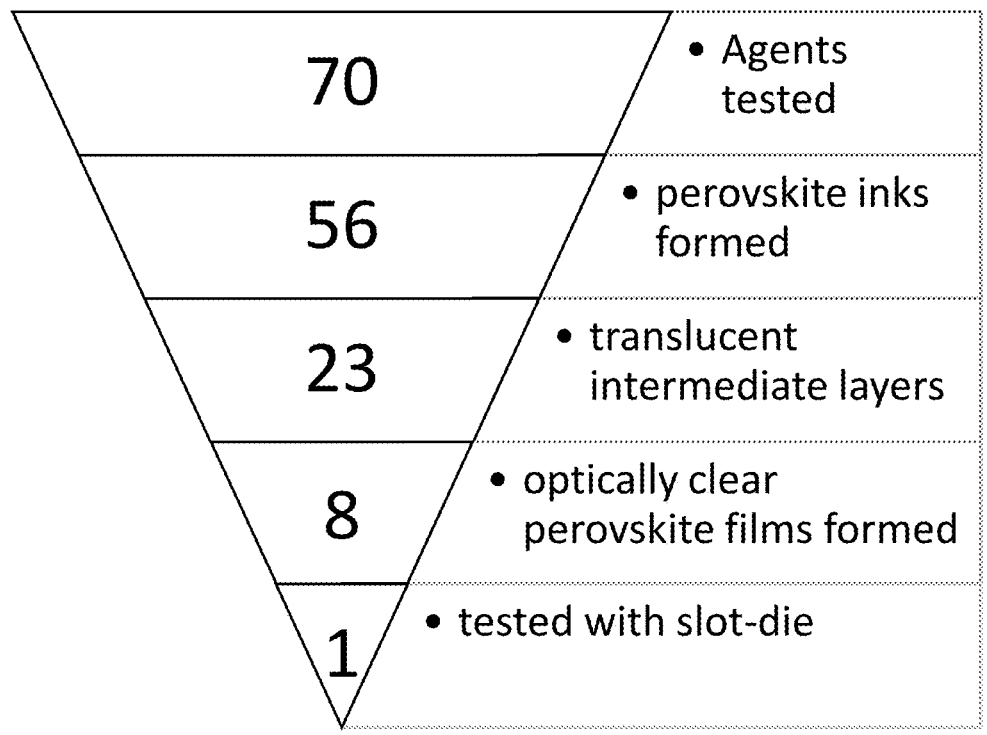
FIGS. 3 and 4 show overall results from complexing agent rapid screening tests, in accordance with some embodiments.

Among the general class of nitrogen donor heterocycles there are several hundred substituted pyridine derivatives that are commercially available in sufficient quantities for future large-scale production. In order to quickly screen them for suitability in perovskite inks, perovskite components were first dissolved in a mixture of DMF and the candidate agent, with the agent concentration chosen as 2 equivalents—i.e. 2 moles of agent per mole of lead—and the Pb concentration as 1 molar in the solution. This first rapid test was to check whether the lead-agent complex, if any, was sufficiently soluble to form a perovskite reactant ink. 56 of the 70 candidate agents passed this first gate with MAPI precursors. In the second rapid test, inks were then spin-coated on glass, and the coatings were tested for translucency. The second rapid test was to check whether the agent inhibited perovskite formation sufficiently to form a translucent precursor layer comparable to the best antisolvent films containing DMSO. 23 of the 56 agents passed this second gate with MAPI precursors. In the third rapid test, precursor layers were annealed to form crystalline perovskite films. The third rapid test checked the growth kinetics of the perovskite during agent evaporation. Samples were first checked visually for optical clarity, then in SEM for grain size and distribution, and finally with time-resolved microwave conductivity to determine electrical properties relevant for solar cells. 8 of the 23 agents passed this third gate with MAPI precursors. The fourth rapid test was to fabricate solar cells with the resulting perovskite films. Of the 8 agents, one agent, 4-tertbutyl pyridine (4-tBP), was tested using scalable slot-die printing and yielded quality MAPI films without anti-solvent treatment. The overall results of each test of the screening method are shown in FIG. 3.

Figure 4:
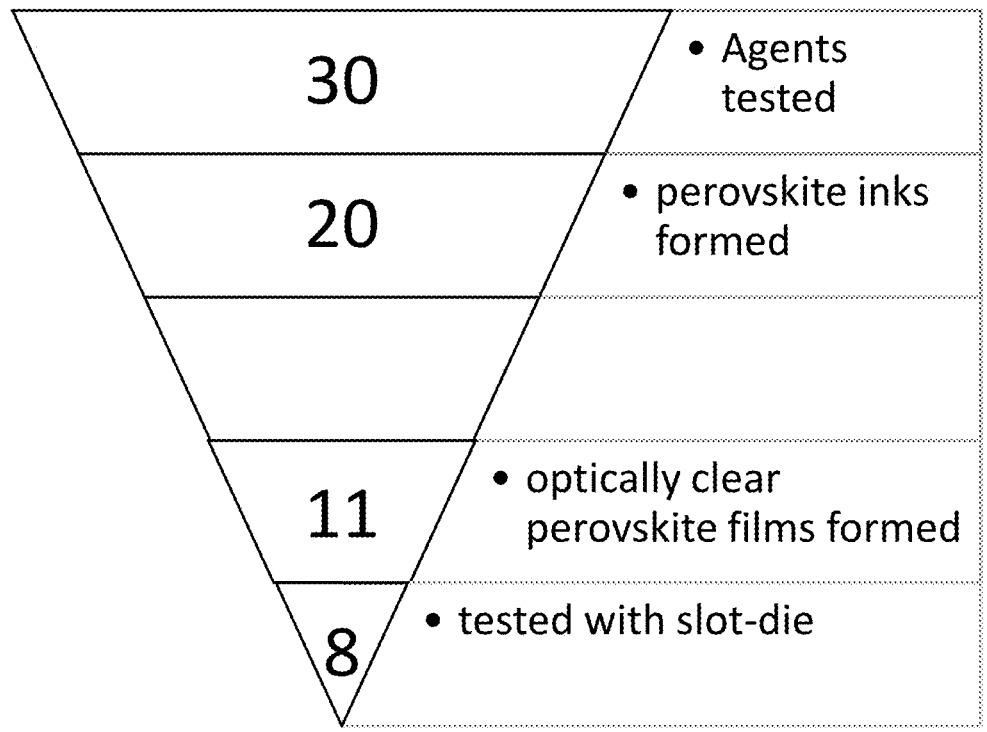

The rapid screening methods described above (with the omission of the translucency/optical clarity test) were also used to evaluate agents for alloy perovskite precursors (e.g., formamidinium cesium lead iodide bromide) and resulted in a total of 11 agents passing the screening tests of which 8 were slot-die printed, and 4-tBP and 4-methoxypyridine were used to demonstrate efficient solar cells without anti-solvent treatments. The overall results of each test of the screening method are shown in FIG. 4. It was found that cesium-halide solubility and cation-bromide solubility were limiting factors that were not considerations when only testing MAPI inks. Further, because of these limitations, the set of agents that passed the MAPI screening tests had only a moderate overlap with the set of agents that passed the formamidinium cesium lead iodide bromide screening tests.

Example 2: Complexing Agent Properties

In this non-limiting Example, the coordination of nitrogen donor heterocycles was demonstrated, and the ratio of complexing agent to lead atoms was determined.

Figure 5:
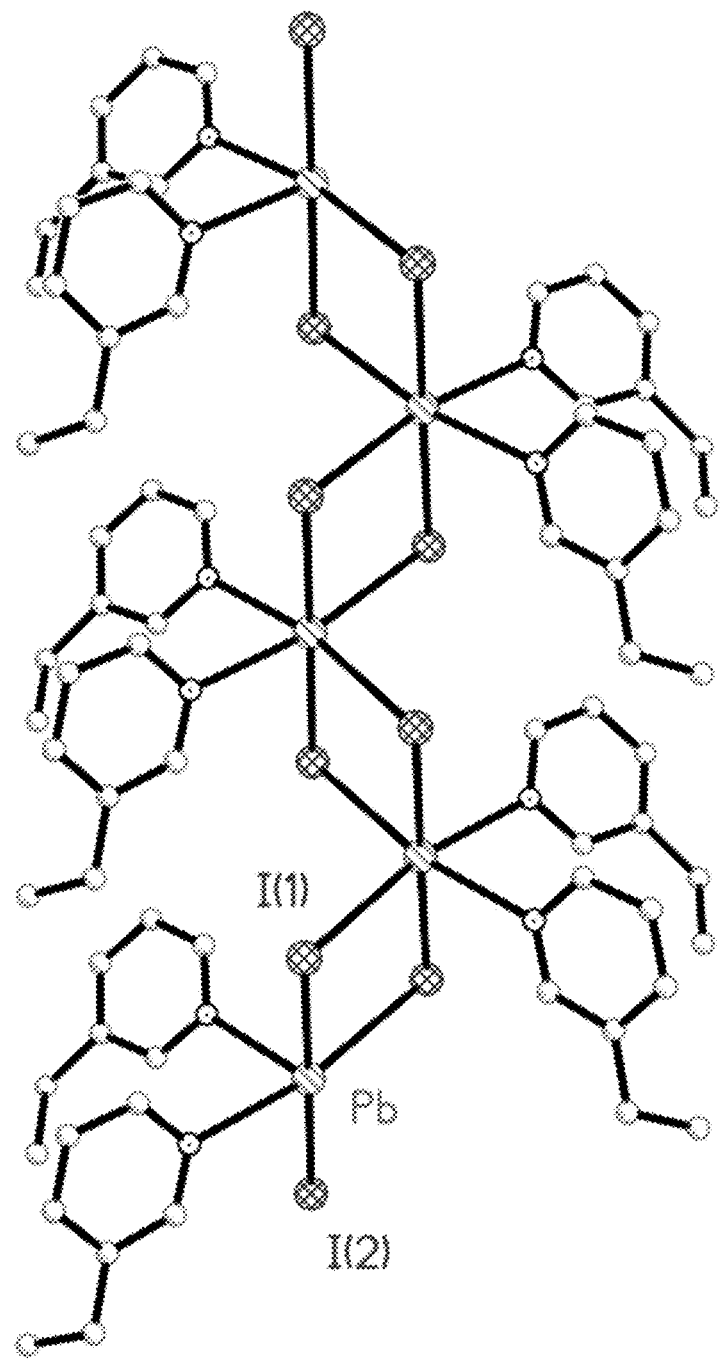
FIG. 5 shows the structure of a $PbI_2(3\text{-Et-Py})_2$ complex isolated from a present ink formulation, in accordance with some embodiments.
Figure 6:
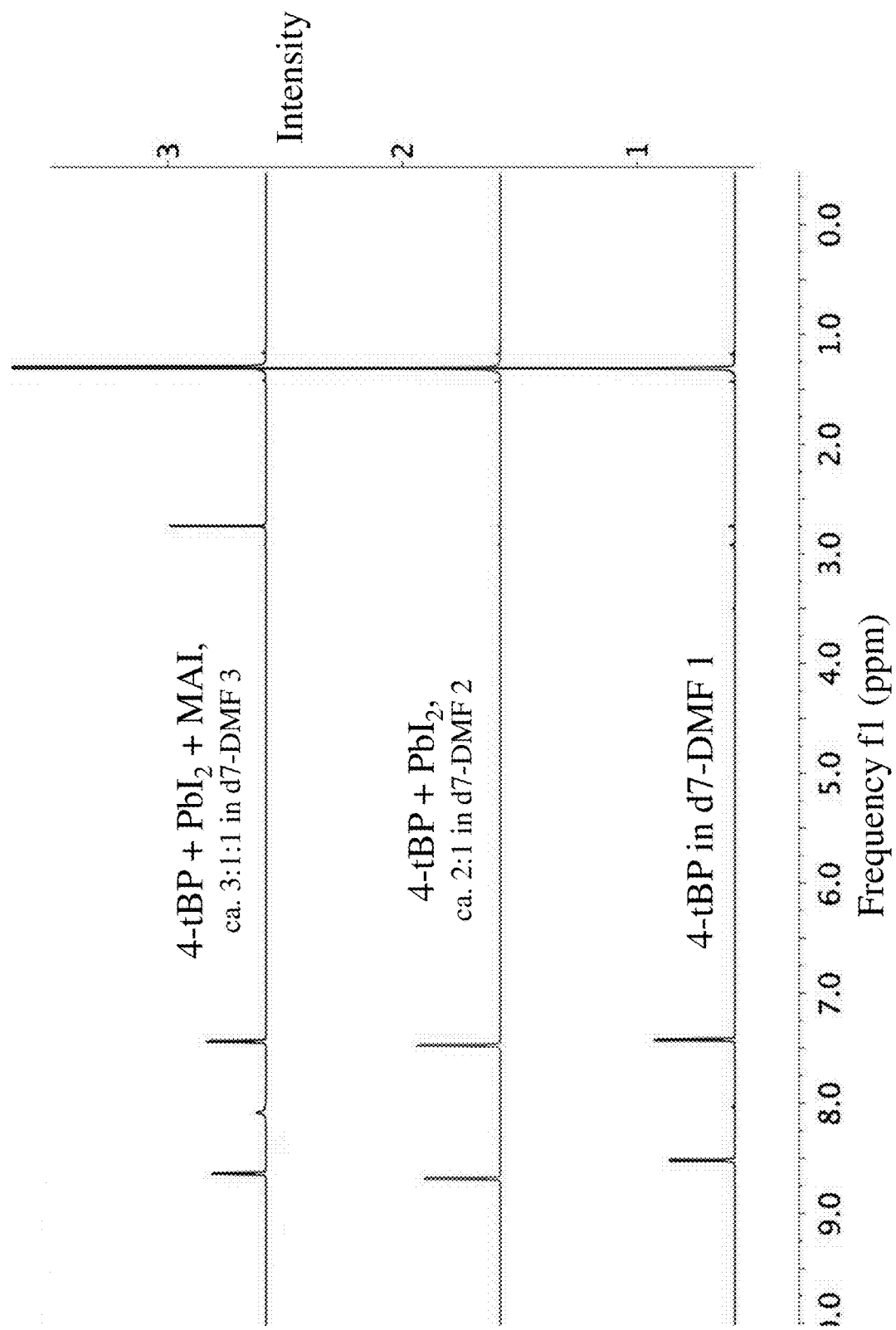
FIG. 6 shows proton nuclear magnetic resonance spectroscopy 1H NMR results used to determine the coordination of a pyridine complexing agent, namely 4-tBP, to lead iodide, in accordance with some embodiments.

A lead iodide-agent crystal with 3-ethylpyridine (3-Et-Py) was isolated from an ink formulation, and the structure was analyzed by single crystal x-ray crystallography. FIG. 5 is the structure of a $PbI_2(3\text{-Et-Py})_2$ complex isolated from one of the ink formulations described in Example 1. The structure in FIG. 5 shows that lead iodide and 3-Et-Py form a 2:1 complex (i.e., 2 equivalents) in the ink solution. This stoichiometry informed the agent concentration in the agent screening tests. In addition, proton nuclear magnetic resonance spectroscopy 1H NMR was used to determine the coordination of a pyridine complexing agent, namely 4-tBP, to lead iodide. FIG. 6 shows the 1H NMR results, which confirm that 4-tBP competes with methylammonium iodide for bonding to lead iodide, enabling it to inhibit and/or control perovskite crystal formation.

Figure 7:
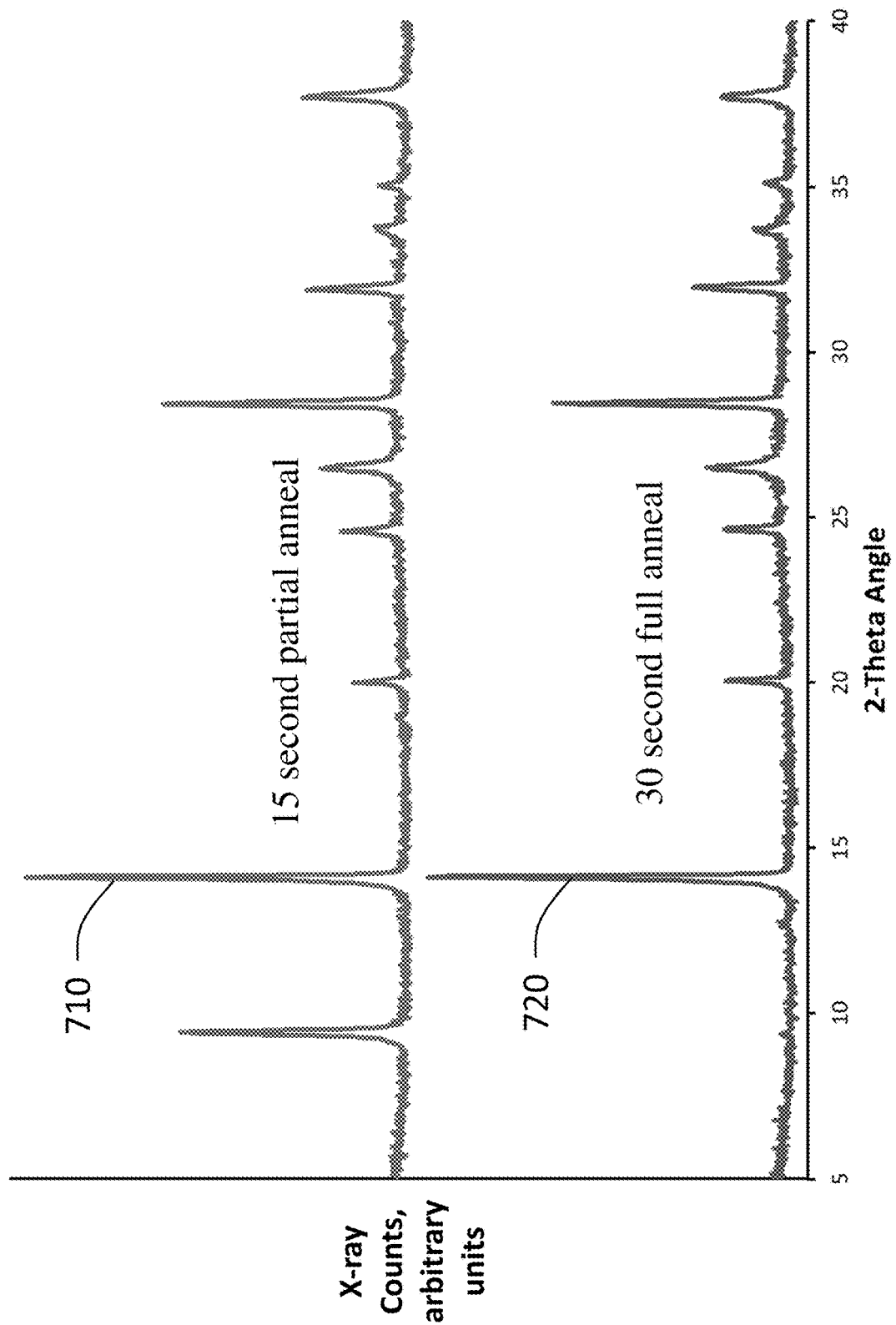
FIG. 7 shows x-ray diffraction (XRD) test results of a present $FA_{0.85}Cs_{0.15}Pb(I_{0.85}Br_{0.15})_3$ (where FA is formamidinium) perovskite film, in accordance with some embodiments.

Example 3: Formation of Lead-Agent Complex and Removal of Agent from Final Perovskite Film In this non-limiting Example, a mixed-cation mixed-halide multi-reactant single ink was prepared by dissolving formamidinium, cesium, and lead iodide and bromide salts in DMF with 2 equivalents 4-methoxypyridine relative to the Pb content. Reactant ink wet films were spin coated at 4000 RPM for about 35 seconds and dried in air. Dried layers were annealed in air at about 250° C. XRD tests of the resulting $FA_{0.85}C_{0.15}Pb(I_{0.85}Br_{0.15})_3$ (where FA is formamidinium) perovskite films are shown in FIG. 7. FIG. 7 contains two scans. 710 is a scan from a film annealed for 15 seconds, and 720 is a scan from a film annealed for 30 seconds. These results show that in addition to various perovskite peaks (e.g., at two theta of about 14, 20, 24, etc. degrees) there is, in the scan of the under-annealed film 710, an XRD peak at two-theta of about 9 degrees indicative of a residual Pb-agent complex. FIG. 7 also shows that in the scan of the fully-annealed film 720, the complex peak at two-theta of about 9 degrees is fully eliminated. This demonstrates that the stable Pb-agent complex that forms in the multi-reactant single ink exists in the dried reactant layer and is fully removed during low temperature annealing (e.g., 250° C.) to form the final perovskite film.

Figure 8:
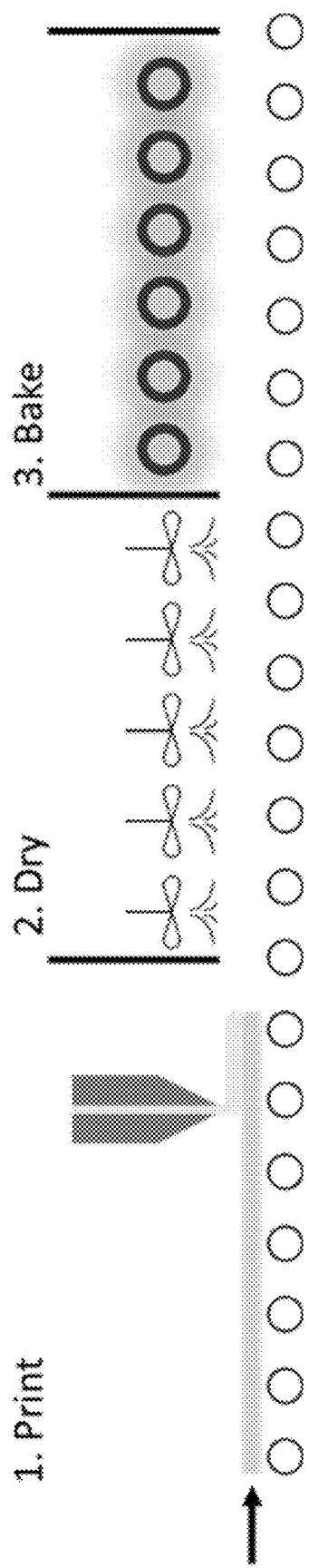
FIG. 8 shows a simplified schematic of a slot-die coater with in-line drying and baking (annealing) sections, in accordance with some embodiments.

Example 4: Slot-Die Coating Perovskite Films from Inks with Complexing Agents In this non-limiting Example, alloy inks were prepared at about 1 molar in DMF with 1.4 equivalents 4-methoxypyridine and the alloys inks were deposited on glass substrates using a customized slot-die coater with an in-line drying step. FIG. 8 shows a simplified schematic of the slot-die coater with in-line drying and baking (annealing) sections. In this Example, the slot-die coating was done in air with a humidity of less than about 10% RH with a gap of 40 microns and a linear coating speed of 1 mm/s, resulting in 2-3 micron thick wet films. No anti-solvent treatment was done. Films were dried under a stream of air with a velocity of approximately 45 cm/sec for 2 minutes. The dried layers were then annealed in low-humidity air for 2 min at 150° C.

Figure 9:
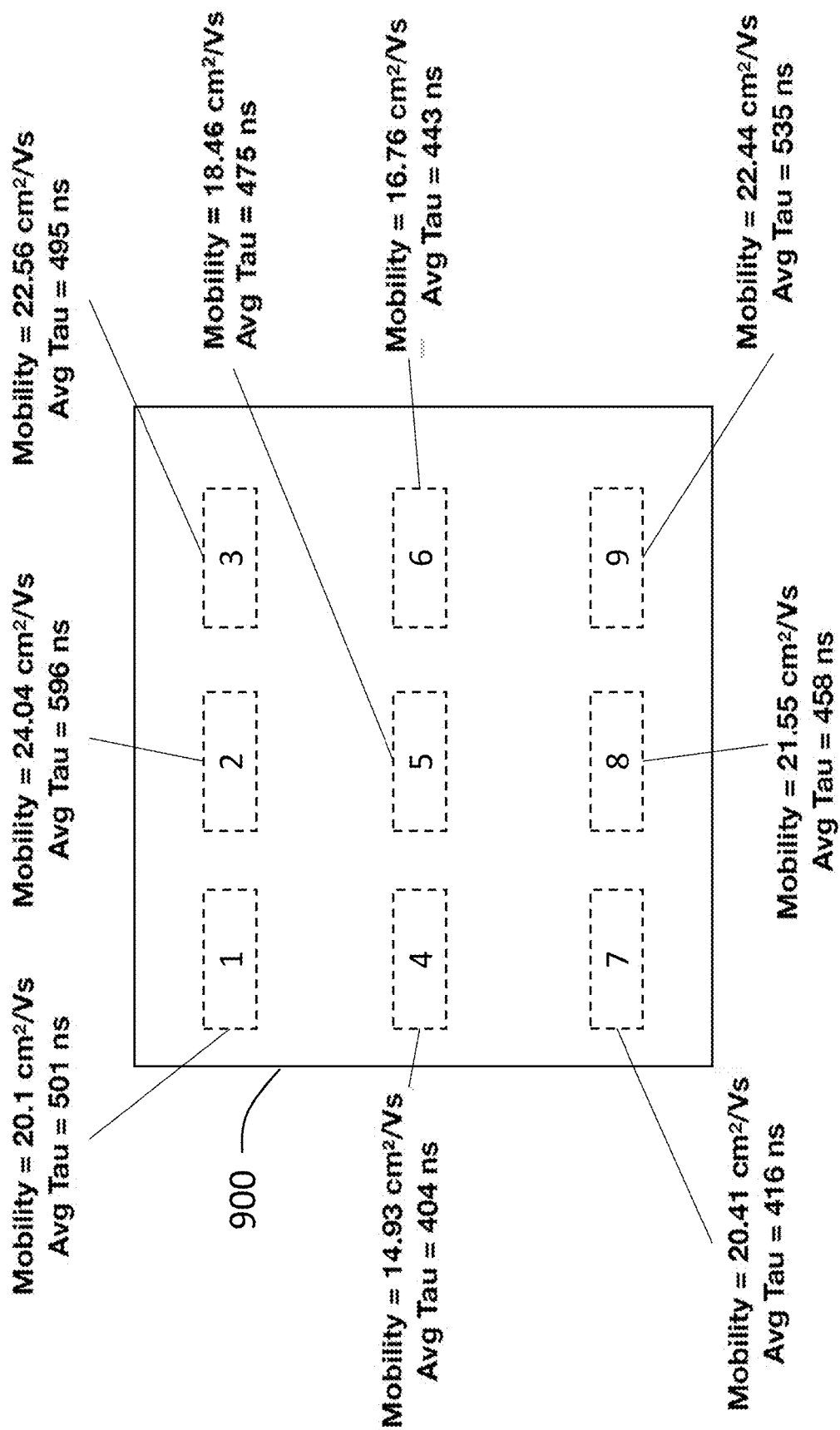
FIG. 9 shows results of time-resolved microwave conductivity (TRMC) measurements taken at 9 locations on a present sample, in accordance with some embodiments.

These slot-die coated films on glass were tested for electronic quality using time-resolved microwave conductivity (TRMC) measurements. FIG. 9 shows the results of the TRMC measurements taken at 9 locations on a 6"×6" coated sample 900. The average lifetime (lifetime is shown as "Tau" in FIG. 9) for the 6"×6" sample in this example was measured by TRMC as 480 ns with a +/−60 ns standard deviation and a top measured lifetime of 596 ns. The average mobility was measured as 20.1 $cm^2$/V-s with a +/−3 $cm^2$/V-s standard deviation and a top measured mobility of 24 $cm^2$/V-s. These film lifetime and mobility results are comparable with those required for absorber layers in high-quality perovskite solar cells.

Example 5: Perovskite Solar Cells from Inks with Complexing Agents

In this non-limiting Example, solar cells were fabricated with a fluorine-doped tin oxide (FTO)/$SnO_2$/Perovskite/spiro-MeOTAD/Au architecture. The $SnO_2$ and spiro-MeOTAD layers were spin-coated, while the perovskite layer was spin-coated or slot-die coated according to the procedures in Example 4. About 50 nm of Au was deposited by e-beam evaporation for a back contact.

Figure 10:
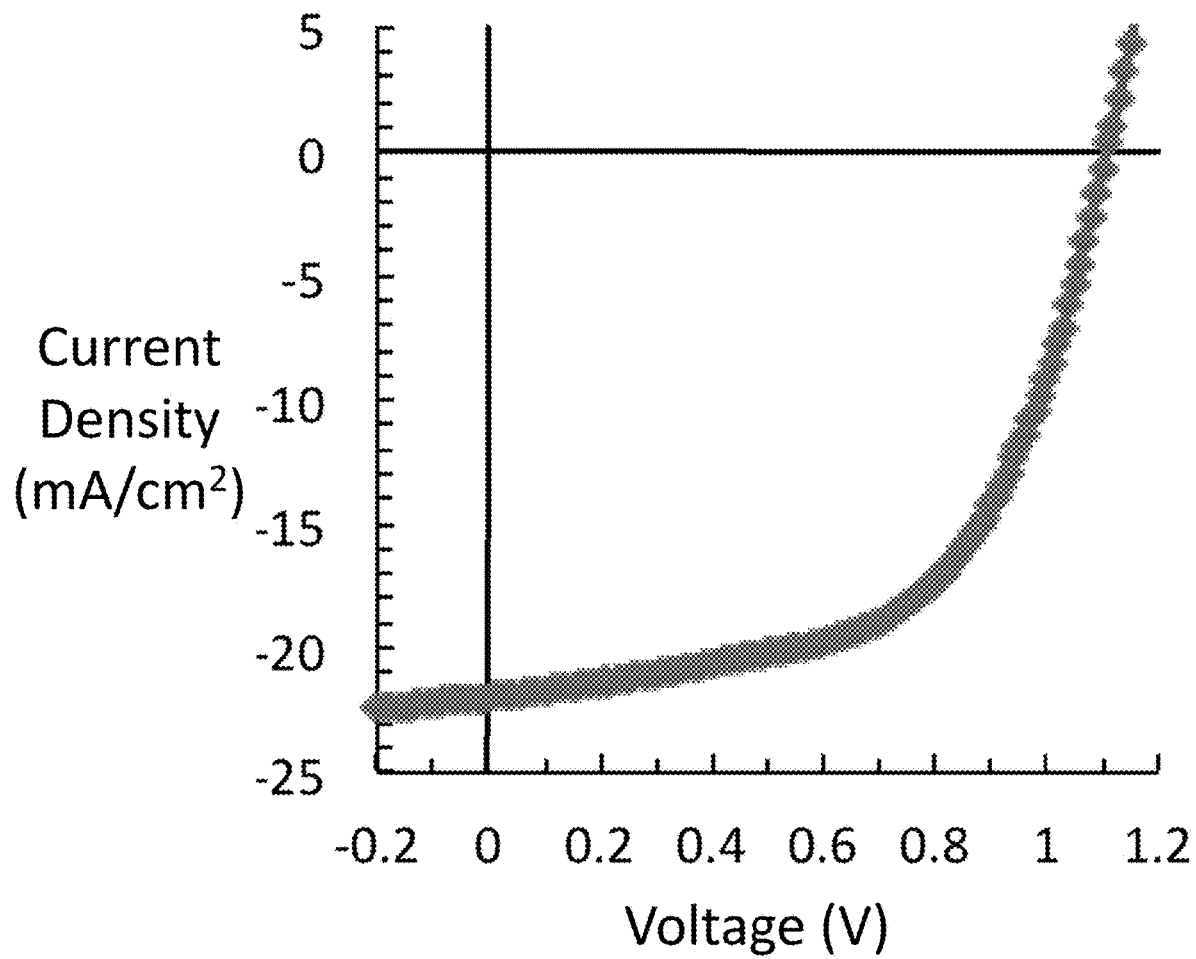
FIG. 10 shows current-voltage characteristics of a present device under AM1.5 illumination using a solar simulator lamp, in accordance with some embodiments.

The solar cells in this Example were fabricated using inks containing 4-methoxypyridine. Various parameters were adjusted in this Example including the complexing agent concentration in the range of 1.0 to 3.0 equivalents with respect to lead, the solution molarity in the range of 0.75 to 1.5, the annealing temperature in the range of 100 to 350° C.), and the annealing time in the range of 10 seconds to 30 minutes. FIG. 10 shows the current-voltage characteristics of the best device produced from these tests under AM1.5 illumination using a solar simulator lamp, which had a 13.9% power conversion efficiency.

To fabricate the solar cells in this Example, patterned tin oxide coated glass was cleaned with successive sonication in detergent, water, acetone and isopropanol. After 20 minutes of UV-ozone treatment, a thin tin oxide layer was cast in air from a 3.0 wt % $SnO_2$ nanoparticle suspension at 3000 RPM for 30 seconds and dried at 150° C. for 30 minutes. After an additional 15 minutes of UV-ozone treatment, the perovskite layer was deposited inside a nitrogen filled glovebox. A 45 µL aliquot of 1.0 M, $(FAPbI_3)_{0.85}$ $(CsPbBr_3)_{0.15}$ is solution with 2 equivalents of 4-methoxypyridine in DMF was spun at 4000 RPM for 20 seconds and then quickly moved directly to a hotplate at 150° C. for 2 minutes. After cooling to room temperature, spiro-MeOTAD was spun at 4000 RPM using a solution comprising 50 mg Spiro-MeOTAD, 20 µL of a 516 mg/mL lithium bis(trifluoromethanesulfonyl)imide (LiTFSI) in acetonitrile and 10 µL of a 375 mg/mL LiTFSI in acetonitrile. After allowing the films to sit in a dry air-filled desiccator overnight, about 50 nm of gold was deposited via electron beam evaporation through a shadow mask at a rate of 0.1 Å/s for the first 5 nm followed by a rate of 0.5 Å/s for the final 45 nm to define a 0.4 $cm^2$ device area.

Solar cell devices were also prepared using a slot-die coated perovskite layer from an ink with complexing agents using processing parameters substantially as described in Example 4. The best slot-die coated device yielded a power conversion efficiency of about 8.3%.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method, comprising:
providing an ink comprising reactants, a complexing agent, and a solvent, wherein:
the reactants comprise a first and a second cation, a first metal, and a first and a second anion, wherein the first and second cations are different from each other, and the first and second anions are different from each other;
the complexing agent comprises a heterocyclic donor material;
depositing the ink onto a substrate to form a wet film;
drying the wet film to form a precursor layer; and
annealing the precursor layer to form a perovskite film, wherein:
the perovskite film comprises a mixed-cation mixed-halide perovskite material;
the perovskite film comprises less than 5% by mass of the complexing agent; and
the perovskite film is formed using a one-step process.

2. The method of claim 1, wherein the heterocyclic donor material is selected from the group consisting of oxygen donors, nitrogen donors, nitrogen-oxygen donors, phosphorous donors, sulfur donors, and selenium donors.

3. The method of claim 1, wherein the heterocyclic donor material is selected from the group consisting of a material listed in Table 1.

4. The method of claim 1, wherein the heterocyclic donor material is selected from the group consisting of pyridine, 4-substituted pyridines, quinoline, and iso-quinoline derivatives.

5. The method of claim 1, wherein the first and second cations are each selected from the group consisting of methylammonium, formamidinium, Cs, K, and Rb.

6. The method of claim 1, wherein the first metal is selected from the group consisting of lead and tin.

7. The method of claim 1, wherein:
the reactants further comprises a second metal;
the first metal is lead; and
the second metal is tin.

8. The method of claim 1, wherein the first and second anions are each selected from the group consisting of bromide, iodide and chloride.

9. The method of claim 1, wherein:
the first cation comprises formamidinium and the second cation comprises Cs;
the first metal comprises Pb; and
the first anion comprises bromide and the second anion comprises iodide.

10. The method of claim 1, wherein the mixed-cation mixed-halide perovskite material comprises:
the first and the second cation, wherein each are selected from the group consisting of methylammonium, formamidinium, Cs, K and Rb;
the first metal selected from the group consisting of Pb and Sn; and the first and the second anion, wherein each are selected from the group consisting of bromide, iodide, and chloride.

11. The method of claim 1, wherein the mixed-cation mixed-halide perovskite material comprises formamidinium cesium lead iodide bromide.

12. The method of claim 1, wherein the mixed-cation mixed-halide perovskite material comprises $FA_{0.85}Cs_{0.15}Pb(I_{0.85}Br_{0.15})_3$, where FA is formamidinium.

13. The method of claim 1, wherein each of the first and second anions, the metal, and the first and second cations have concentration ratios in the ink that are less than 5% different from targeted concentration ratios in the perovskite film.

14. The method of claim 1, wherein each of the first and second anions, the first metal, and the first and second cations have concentration ratios in the ink that are less than 5% different from concentration ratios in a stoichiometric perovskite film.

15. The method of claim 1, wherein:
the complexing agent has greater than 0.05 molar solubility relative to the reactants;
the complexing agent has a complex binding strength to the first metal greater than that of dimethylformamide (DMF) and less than that of dimethylsulfoxide (DMSO); and
the complexing agent has a boiling point less than 200° C.

16. The method of claim 1, wherein the solvent is selected from the group consisting of an anhydrous solvent, a polar solvent, dimethylformamide (DMF), dimethylacetamide (DMAC), and combinations thereof.

17. The method of claim 1, wherein the depositing, drying or annealing steps, or the depositing, drying and annealing steps, are performed in dehumidified air with less than 5% RH.

18. The method of claim 1, wherein the depositing, drying or annealing steps, or the depositing, drying and annealing steps are performed in an atmosphere comprising less than 1% oxygen.

19. The method of claim 1, wherein the drying step is performed in an environment of nitrogen forced convection, an environment of air forced convection, or a low-pressure environment with pressure from 0.01 Pa to 3000 Pa.

20. The method of claim 1, wherein the drying step is performed in an environment with a controlled partial pressure of the solvent.

21. The method of claim 1, wherein the annealing step is performed at a temperature from 70° C. to 350° C.

22. The method of claim 1, wherein the perovskite film is formed without the use of any anti-solvents.

23. The method of claim 1, wherein an equivalent ratio of the complexing agent relative to the first metal concentration in the ink is from 0.5 to 5.

24. The method of claim 1, wherein the first metal molarity in the ink is from 0.25 to 1.5 moles of the first metal per liter of the ink.

25. The method of claim 1, wherein the perovskite film comprises an undetectable amount of the complexing agent when measured by x-ray diffraction (XRD), x-ray photoelectron spectroscopy (XPS), or Fourier transform infrared spectroscopy (FTIR).

26. A method, comprising:
providing an ink comprising reactants, a complexing agent, and a solvent, wherein:
the reactants comprise a first and a second cation, a first metal, and a first and a second anion, wherein the first and second cations are different from each other, and the first and second anions are different from each other;
depositing the ink onto a substrate to form a wet film, wherein the depositing step is performed using spin-coating, slot-die coating, blade coating, dip coating, spraying, screen printing, ink-jet printing, gravure printing, offset printing, or waterfall coating;
drying the wet film to form a precursor layer; and
annealing the precursor layer to form a perovskite film, wherein:
the perovskite film comprises a mixed-cation mixed-halide perovskite material;
the perovskite film comprises less than 5% by mass of the complexing agent; and
the perovskite film is formed using a one-step process.

27. The method of claim 26, wherein the complexing agent comprises:
a molar solubility greater than 0.05 to at least one of the reactants;
a complex binding strength to the first metal greater than that of dimethylformamide (DMF) and less than that of dimethylsulfoxide (DMSO); and
a boiling point less than 200° C.

28. A method, comprising:
providing an ink comprising reactants, a complexing agent, and a solvent, wherein:
the reactants comprise a first and a second cation, a first metal, and a first and a second anion, wherein the first and second cations are different from each other, and the first and second anions are different from each other;
the complexing agent comprises:
a molar solubility greater than 0.05 to at least one of the reactants;
a complex binding strength to the first metal greater than that of dimethylformamide (DMF) and less than that of dimethylsulfoxide (DMSO); and
a boiling point less than 200° C.;
depositing the ink onto a substrate to form a wet film, wherein the depositing step is performed using spin-coating, slot-die coating, blade coating, dip coating, spraying, screen printing, ink jet printing, gravure printing, offset printing, or waterfall coating;
drying the wet film to form a precursor layer: and
annealing the precursor layer to form a perovskite film, wherein the perovskite film comprises:
a mixed-cation mixed-halide perovskite material: and
less than 5% by mass of the complexing agent.

* * * * *

UNITED STATES PATENT AND TRADEMARK OFFICE
CERTIFICATE OF CORRECTION

PATENT NO. : 11,177,439 B2  
APPLICATION NO. : 16/808175  
DATED : November 16, 2021  
INVENTOR(S) : Colin David Bailie, Chris Eberspacher and Matthew Cornyn Kuchta It is certified that error appears in the above-identified patent and that said Letters Patent is hereby corrected as shown below:

In the Claims

Claim 1, Column 16, Line 23:
Please delete "depositing the ink onto a substrate to form a wet film;" and insert --depositing the ink onto a substrate to form a wet film, wherein the depositing step is performed using spin-coating, slot-die coating, blade coating, dip coating, spraying, screen printing, ink-jet printing, gravure printing, offset printing, or waterfall coating;--.

Signed and Sealed this  
Fifth Day of April, 2022

Drew Hirshfeld  
*Performing the Functions and Duties of the*  
*Under Secretary of Commerce for Intellectual Property and*  
*Director of the United States Patent and Trademark Office*